United States Patent
Chen et al.

(10) Patent No.: US 12,261,611 B2
(45) Date of Patent: Mar. 25, 2025

(54) CLOCK SIGNAL TRANSITIONING FOR MULTI-MODE AUDIO PROCESSING SYSTEMS

(71) Applicant: Cirrus Logic International Semiconductor Ltd., Edinburgh (GB)

(72) Inventors: Jianqi Chen, Austin, TX (US); Jaiminkumar Mehta, Austin, TX (US); Bhoodev Kumar, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 18/353,094

(22) Filed: Jul. 16, 2023

(65) Prior Publication Data

US 2025/0023573 A1    Jan. 16, 2025

(51) Int. Cl.
*H03L 7/099* (2006.01)
*H03L 7/093* (2006.01)

(52) U.S. Cl.
CPC ............ *H03L 7/0991* (2013.01); *H03L 7/093* (2013.01)

(58) Field of Classification Search
CPC ... H03L 7/0991; H03L 7/0992; H03L 7/0994; H03L 7/099; H03L 7/08; H03L 7/095; H03L 7/093; H03L 7/0997; H03L 7/0998; H03L 7/10; H03L 7/105; H03L 7/0805; H03L 7/06; H03L 7/00
See application file for complete search history.

(56) References Cited

U.S. PATENT DOCUMENTS

| | | | |
|---|---|---|---|
| 2007/0222526 A1* | 9/2007 | Mayer | H03B 5/1228 331/34 |
| 2008/0129398 A1* | 6/2008 | Sun | H03L 7/107 331/117 FE |
| 2008/0155285 A1* | 6/2008 | Viitaniemi | G06F 1/3237 713/320 |
| 2008/0317185 A1 | 12/2008 | Mueller et al. | |
| 2013/0223635 A1 | 8/2013 | Singer et al. | |
| 2016/0218721 A1 | 7/2016 | Herbeck | |
| 2018/0095119 A1* | 4/2018 | Chillara | H03L 7/08 |
| 2021/0376841 A1* | 12/2021 | Okada | H03B 5/02 |
| 2024/0171181 A1* | 5/2024 | Elmallah | H03L 7/0812 |

* cited by examiner

*Primary Examiner* — Khanh C Tran
(74) *Attorney, Agent, or Firm* — Norton Rose Fulbright US LLC

(57) ABSTRACT

Methods and systems for determining clock signals for audio processing using different operating modes are provided. In one aspect, a transition control word is determined to transition from a first control word for a first operating mode to a second control word for the second operating mode. The transition control word may be used to process the received audio signal while transitioning between the operating modes. After the transition, the second control word may be used to process the received audio signal using the second operating mode. The transition control word may be used to transition between various aspects of the operating modes, including different frequencies or resolutions, control systems, power levels, and more.

20 Claims, 5 Drawing Sheets

CLOCK SIGNAL TRANSITIONING FOR MULTI-MODE AUDIO PROCESSING SYSTEMS

FIELD OF THE DISCLOSURE

The instant disclosure relates to audio processing circuitry. More specifically, portions of this disclosure relate to different resolutions of digitally-controlled oscillator (DCO) for reducing power consumption in audio processing circuitry.

BACKGROUND

Changing power modes, such as power sources or power levels, in electronic circuitry can result in abrupt changes. These abrupt changes can impact the user experience in working with devices that are changing power modes, and the abrupt changes can be particularly noticeable to a user when the power mode changes during a continuous process. Power modes are frequently changed in mobile devices to adjust power consumption to the current use of the device, thereby prolonging battery runtime and reducing the number of times a user needs to charge the battery during the day. Audio processing circuitry is one example of an electronic circuit that has a significant impact on user experience because users are frequently listening to audio on mobile devices, either as music, a podcast, part of a video, or as notification sounds for messages and ringtones. The changing of a power mode for audio processing circuitry during the generation of audio signals can cause changes in signals during audio recording or playback that create artifacts in the reproduced audio sounds such as pops and clicks.

SUMMARY

Electronic circuits operate using clock signals that time the processing of signals in the circuit. Switching power modes in an electronic circuit may be performed adjusting a phase locked loop (PLL) that generates the clock signal. A digital phase locked loop (DPLL) may be switched between power modes with different performance levels with reduced or inaudible glitches by transitioning the DPLL from the first mode to the second mode. The different power modes with different performance levels may correspond to a high-resolution mode (consuming higher power) and a low-resolution mode (consuming lower power). The high-resolution mode may be used for recording and playback of audio such as music or high-definition music, while the low-resolution mode may be used for voice command detection and playback of ringtones or notification sounds.

Allowing audio processing circuitry, such as an audio controller, to transition from high-resolution mode to low-resolution mode allows the circuitry to support dynamic operation that outputs high-quality audio when desired but also reduce power consumption. For example, the audio processing circuitry may provide high-quality audio playback for music in high-resolution mode while also reducing power consumption when the audio playback is off in low-resolution mode. As another example, the audio processing circuitry may provide high-quality (e.g., high resolution) recording in a first operation mode while also reducing power consumption when the audio processing circuitry provides low-quality (e.g., low resolution) recording in a second operation mode. The first and second operating mode may target the same clock frequency for operation, but different resolution clock signals between the two operating modes may result in a minor difference between the clock signal when operating in the first and second operating modes. The difference in clock frequency between the higher-power, higher-resolution operating mode and the lower-power, lower-resolution operating mode may be less than 2%, less than 1%, less than 0.5%, or otherwise approximately the same. Using the recording example, the different operating modes may be used, for example, to perform keyword detection in the lower-power, lower-resolution operating mode, and switch to the higher-power, higher-resolution operating mode for speech command detection.

A direct switch between power modes causes glitches (audible artifacts). Transitioning between the power modes reduces the audible artifacts. Shortcomings mentioned here are only representative and are included simply to highlight that a need exists for improved electrical components, particularly for audio circuitry employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

In some example circuits, the power modes may correspond to open-loop operation of a DPLL for low-resolution mode and closed-loop operation of a DPLL for high-resolution mode. The open-loop mode of the DPLL may generate the clock signal using a fixed N-bit (e.g., 7-bit) DCO code. The fixed input to the DCO results in reduced power consumption in the open-loop mode, although also reducing the performance of circuitry driven by the clock signal. The closed-loop mode of the DPLL may use additional circuitry to provide feedback in the DPLL and provide higher control resolution for DCO using an N-bit modulated DCO code, which improves the performance of circuitry driven by the clock signal. Transitioning from the modulated DCO code to the fixed N-bit DCO code may include determining an N-bit DCO code corresponding to the current modulated DCO code in the closed-loop operation and transitioning from that modulated N-bit DCO code to the fixed N-bit DCO code.

Electronic devices incorporating the clock generation circuits (e.g., digital phase locked loop (DPLL)) described above may benefit from improved sound quality and improved power efficiency. Integrated circuits of the electronic devices may include an audio controller with the described functionality. For example, the audio controller may include a DPLL circuit for generating an internal clock signal from a reference clock generated external to and provided to the audio controller. The IC may also include an analog-to-digital converter (ADC) and/or digital-to-analog converter (DAC). The ADC may be used to convert an analog signal, such as an audio signal, to a digital representation of the analog signal. The DAC may be used to convert a digital signal, such as a music file, to an analog representation of the digital signal for reproduction of sounds encoded in the music file through a speaker. Such an audio controller may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like.

According to one embodiment, an apparatus includes a clock controller comprising a digitally controlled oscillator (DCO), the clock controller configured to perform operations comprising receiving a first input signal corresponding to a first operating mode having a first resolution for the DCO and a second input signal corresponding to a second operating mode having a second resolution for the DCO lower than the first resolution; determining, based on the first input signal, a first control word for an output clock signal during the first operating mode; determining a transition control word for determining the output clock signal during a transition from the first operating mode to the second operating mode; and determining, based on the second input signal, a second control word for an output signal during the second operating mode.

In certain embodiments, the first operating mode is a high power operating mode and the second operating mode is a low power operating mode. The first and second operating modes may correspond to different accuracies for an output of the clock controller, and those different clock frequency accuracies may cause lower audio quality. The lower audio quality may be acceptable in certain situations, particularly when power savings is achieved for those situation. For example, the low power operating mode may be used to detect a keyword in speech recognition operations, after which the clock controller is configured to switch from the second operating mode to the first operating mode to obtain more accurate audio for recognizing speech in a speech command.

In certain embodiments, the two operating modes may employ an open-loop or low-resolution feedback control system and a closed-loop or high-resolution feedback control system. The closed-loop control system may be configured to receive a current clock signal from the DCO and a reference clock signal; and determine the first input signal based on the current clock signal and the reference clock signal. The clock controller is configured to disable at least part of the closed-loop control system during the second operating mode. The open-loop control system may be configured to determine the second control word based on the second input signal, wherein the second input signal identifies a target frequency value for the second operating mode. The closed-loop control system is configured to determine the first input signal, wherein determining the transition control word comprises setting an initial value of the closed-loop control system based on the target frequency value; reducing an error gain of the closed-loop control system; and determining the transition control word based on an output signal from the closed-loop control system. In certain embodiments, the initial value of the closed-loop control system is set such that the output signal from the closed-loop control system is initially equal to the target frequency value.

In some embodiments, a converter configured to receive an output of the DCO and to process an analog signal based on the output of the DCO at a first resolution using a first power level during the first operating mode and at a second resolution using a second power level during the second operating mode.

In certain embodiments, determining the transition control word comprises: determining a current frequency value of the first input signal; determining a target frequency value corresponding to the second control word; and determining at least one transition control word to transition from the current frequency value to the target frequency value at a rate less than or equal to a predetermined threshold.

According to another embodiment, a method may include receiving a first input signal corresponding to a first operating mode having a first resolution for a digitally-controlled oscillator (DCO) and a second input signal corresponding to a second operating; determining, based on the first input signal, a first control word for an output clock signal from the DCO in the first operating; determining a transition control word for determining the output clock signal from the DCO during a transition from the first operating mode to the second operating mode; and determining, based on the second input signal, a second control word for the output clock signal from the DCO during the second operating mode. Certain embodiments of the method may include specific operations described above regarding the apparatus and/or other operations described below with reference to the figures.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
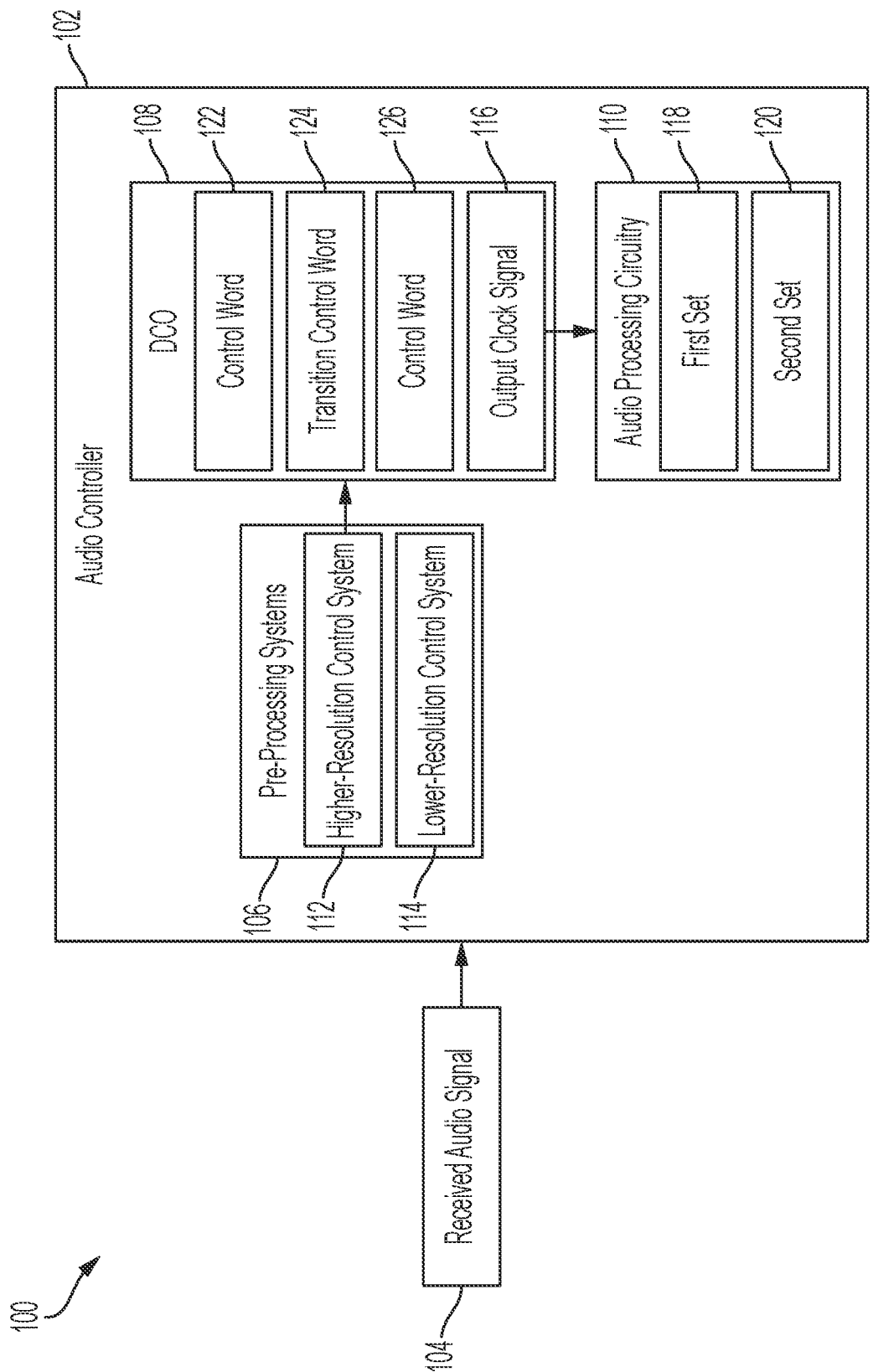
FIG. 1 depicts an example system for transitioning audio processing operating modes according to one aspect of the present disclosure.

Audio processing chips may be configured to operate in different modes, such as one or more high-performance modes and low-power modes. High-performance modes are typically used when the highest possible audio quality is required. In such modes, the audio processing chip operates at a higher resolution and consumes more power to achieve the desired level of audio fidelity. On the other hand, low-power modes may be employed when power consumption is a primary concern. In this mode, the audio processing chip operates at a lower resolution, resulting in reduced power consumption at the expense of audio quality.

However, switching between modes (such as between low-resolution and high-resolution modes) can cause audible artifacts in the audio stream. In such modes, certain circuitry of an audio controller, such as the digitally-controlled oscillator (DCO), consume less power and operate at different frequencies or with different precision in low-resolution mode and high-resolution mode. When transitioning between these modes, directly switching between the modes can cause the clock frequency to change quickly, which may result in audible artifacts. For instance, transitioning from open-loop mode (using a fixed 7-bit DCO trim code) to closed-loop mode (using a 20-bit integrator output) may create audio artifacts.

Pop and click audio artifacts may be caused by as little as a 0.1% abrupt DCO frequency change in a data converter during a clock switch operation. In certain instances, there may be two sources of this frequency change: trim accuracy and the initial frequency of the PLL loop. Regarding trim accuracy, the open-loop trimmed DCO frequency may not match the final closed-loop DCO frequency, leading to errors. Regarding the initial frequency of the PLL loop, the PLL may start with a fixed DCO code that results in a frequency error compared to the trimmed open-loop frequency.

According to aspects of this disclosure, a transition control word is applied to a DCO for use in transitioning between different types of clock signals used for different operating modes. In some embodiments, a method is provided that includes receiving input signals that correspond to two or more different operating modes and determining control words for these operating modes based on the input signals. The first control word may be used to determine an output clock signal used for processing audio signals, such as received audio signals, in a first operating mode. To transition between two operating modes, such as from the first operating mode to a second operating mode, a transition control word may be determined that transitions from the first control word to a second control word for the second operating mode. The transition control word may be used to determine an output clock signal for use in processing the received audio signal while transitioning between the operating modes. After the transition control word, a second control word may be determined and used to determine an output clock signal for processing the received audio signal using the second operating mode. The transition control word may be used while transitioning between various aspects of the operating modes, including clock signals with different frequencies or resolutions, different types of control systems, different power operating levels, and the like.

FIG. 1 depicts a system for transitioning audio processing operating modes according to one aspect of the present disclosure. The system 100 includes an audio controller 102 that receives an audio signal 104. The audio controller 102 includes pre-processing systems 106, a digitally-controlled oscillator (DCO) 108, and audio processing circuitry 110. The pre-processing systems 106 includes a higher-resolution control system 112 (which, in some embodiments, may be a closed-loop control system 112) and a lower-resolution control system 114 (which, in some embodiments, may be an open-loop control system 114). The DCO 108 generates an output clock signal 116. The audio processing circuitry 110 includes a first configuration set 118 and a second configuration set 120 of processing circuitry.

The audio controller 102 may be configured to process the received audio signals using multiple operating modes, such as a first operating mode and a second operating mode. The operating modes, may include a high-power operating mode and a low-power operating mode. In certain embodiments, operating modes for processing audio signals may be implemented in multiple ways. For example, different operating modes may have different resolutions, clock frequencies, and different sets of processing circuitry (such as clock pre-processing circuitry, clock signal processing circuitry, audio signal processing circuitry, and the like). These different operating modes may correspond to different configurations (i.e., first set and second set) 118, 120 for the audio processing circuitry 110. The configurations 118, 120 may include different control of hardware or different sets of hardware of the audio processing circuitry 110.

As one specific example, the pre-processing systems 106 may include one or more control systems that are used for different operating modes, such as to generate clock signals with different precision for these operating modes. For instance, one operating mode may use a closed-loop control system 112 to generate a control word for the DCO 108 and another operating mode may use an open-loop control system 114 to generate a control word for the DCO 108. As another example, different operating modes may include different audio processing circuitry. For instance, one operating mode may use a first set 118 of the audio processing circuitry 110 and another operating mode may use a second set 120 of the audio processing circuitry 110. Certain embodiments may include more than two operating modes, and each mode may have different settings, different processing circuitry, and the like.

In certain embodiments, processing the received audio signal 104 may include digital to analog conversion for playback of the received audio signal 104. In certain embodiments, processing the received audio signal 104 may include analog to digital conversion for recording of the received audio signal 104 as a digital file for storage or transmission.

The DCO 108 may be configured to determine a clock signal that is used by the audio processing circuitry 110 while processing the received audio signal 104 (such as by an analog-to-digital converter, a digital-to-analog converter, and the like). In certain embodiments, the output clock signal 116 may be determined by an oscillator within the DCO 108 based on received information. For example, the pre-processing systems 106 may include clock signal pre-processing systems that determine one or more control signals for the DCO 108, which are then used by the DCO 108 to determine a clock signal (such as at a specified frequency received from the pre-processing systems 106). The DCO 108 may receive input signals from the pre-processing systems 106 for use in determining the output clock signal 116. For example, the DCO may receive or otherwise determine a first control word 122, a transition control word 124, and a second control word 126. As explained further below, the first control word 122 may be used to determine the output clock signal 116 during a first operating mode, the second control word 126 may be used to determine the output clock signal 116 during a second operating mode, and the transition control word 124 may be used while transitioning from the first operating mode to the second operating mode.

Figure 2:
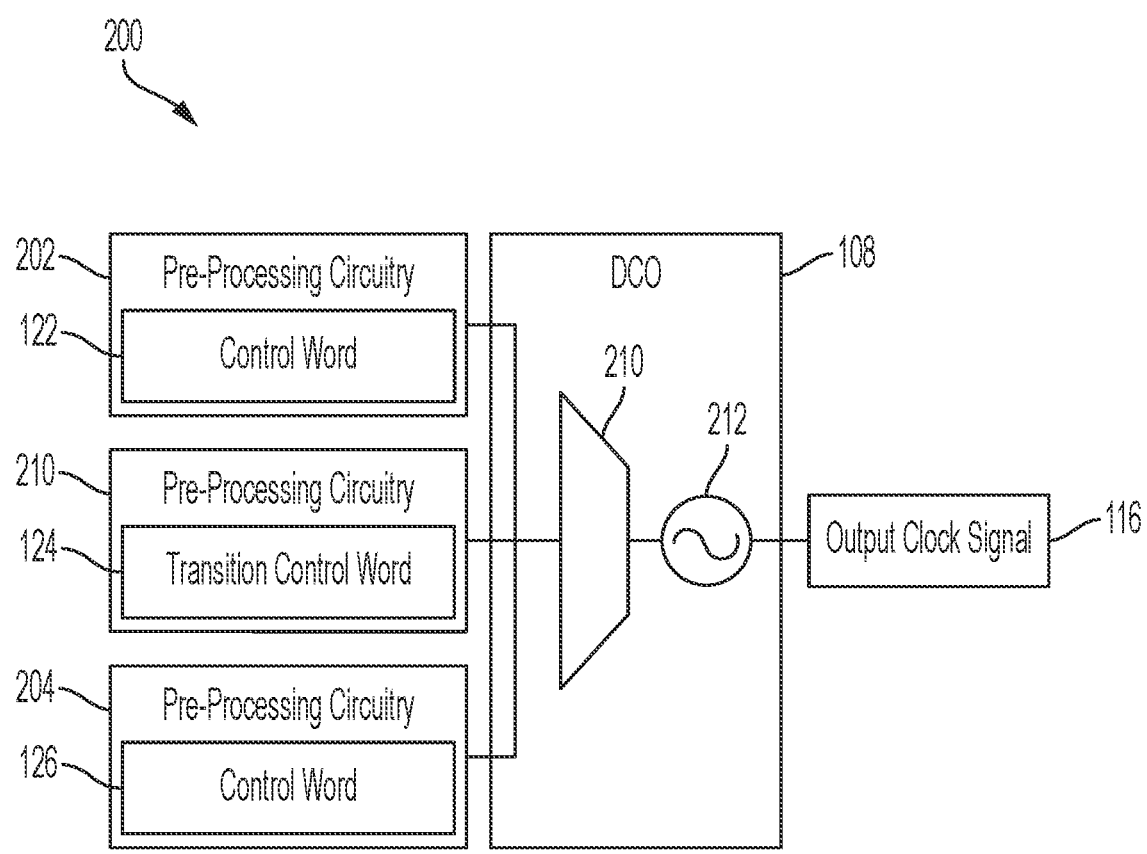
FIG. 2 depicts an example system for determining an output clock signal for one or more operating modes according to one aspect of the present disclosure.

FIG. 2 depicts a system 200 for determining an output clock signal for one or more operating modes according to one aspect of the present disclosure. The system 200 may be one embodiment of the audio controller 102, including the DCO 108 of the audio controller 102. The system 200 includes the DCO 108 and three sets of pre-processing circuitry 202, 204, 210. The first pre-processing circuitry 202 may determine the first control word 122. The second pre-processing circuitry 204 may determine the second control word 126. The transition pre-processing circuitry 210 may determine the transition control word 124. The DCO 108 is configured to determine the output clock signal 116 based on one of the control words 122, 124, 126. In particular, the DCO 108 includes a multiplexer 210 and an oscillator 212, which may be used to determine the output clock signal 116. Although a multiplexer 210 is shown, the DCO 108 may, in some embodiments, be configured natively to receive two inputs as a multi-mode DCO. The DCO 108 may also switch modes, in addition to the audio processing circuitry, to a lower-power mode for operation in the second operation mode to further reduce power consumption.

The DCO 108 may be implemented as one or more electronic circuits configured to generate an output clock signal 116 for use by one or more components of the audio controller 102 (such as the audio processing circuitry 110). In particular, the DCO 108 may convert, using the oscillator 212 and/or other circuitry, the control words 122, 124, 126 into a steady oscillating waveform at a specific frequency (such as the output clock signal 116). The oscillator 212 may be implemented using one or more quartz crystal oscillators, ring oscillators, voltage-controlled oscillators (VCOs), and the like. In certain embodiments, different operating modes may use different oscillators 212 within the DCO 108. In additional or alternative embodiments, the oscillator 212, or other circuitry of the DCO 108, may operate in different power modes (such as using different amounts of power) in certain operating modes.

In certain embodiments, the first control word 122 and the second control word 126 may specify different types of clock signals for the output clock signal 116, such as clock signals with different frequencies, different resolutions, and the like. As one example, the first control word 122 may provide a 7-bit resolution and the second control word may provide a 20-bit resolution for more precision.

The DCO 108 may be configured to determine an output clock signal 116 by the oscillator 212 based on the first control word 122 while processing received audio signals in the first operating mode. The DCO 108 may also be configured to determine the output clock signal 116 by the oscillator 212 based on the second control word 126 while processing received audio signals in the second operating mode. The DCO 108 may also be configured to determine the output clock signal 116 by the oscillator 212 based on the transition control word 124 while transitioning between operating modes (such as from the first operating mode to the second operating mode or vice-versa). In particular, the pre-processing circuitry 210 may determine transition control word 124 such that the output clock signal 116 transitions between operating modes without creating audible distortions when processing the received audio signal 104.

In certain embodiments, the DCO 108 may select between the first control word 122, the second control word 126, and the transition control word 124. For example, the DCO 108 may select between the control words 122, 124, 126 using the multiplexer 210. In additional or alternative embodiments, the DCO 108 may select using other methods. For example, the DCO 108 may only receive one of the first control word 122 and the second control word 126 such that the oscillator 212 only receives a single control word for the output clock signal 116.

Particular techniques for determining the transition control word 124 are discussed in greater detail below. It should also be noted that, for clarity and brevity, the present disclosure discusses examples in terms of transitioning from the first operating mode to the second operating mode and/or in terms of transition from the first control word 122 to the second control word 126. In practice, one skilled in the art should understand that similar techniques can be used for the inverse transition (e.g., from the second operating mode to the first operating mode, from the second control word 126 to the first control word 122). Furthermore, one skilled in the art will appreciate, as noted above, that the audio controller 102 may be configured to utilize more than two operating modes. In such instances, similar techniques may be used to transition between different operating modes (such as depending on how the operating modes are implemented based on the discussions/examples below).

In certain embodiments, the pre-processing circuitry 202, 204, 210 may share one or more components. In additional or alternative embodiments, two or more of the pre-processing circuitry 202, 204, 210 may be implemented using separate circuitry components within the audio controller 102 (such as separate low-power components and high-power components).

In certain embodiments, the DCO 108 may be configured to output the transition control word 124 for processing the received audio signal 104 using at least one of the first operating mode and the second operating mode. For example, in certain embodiments, the transition control word 124 may be used to determine an output clock signal 116 that is provided to the audio processing circuitry 110 during a transition from the first operating mode to the second operating mode. In certain embodiments, the audio processing circuitry 110 may use this output clock signal 116 to process the received audio signal 104 in the first operating mode. In additional or alternative embodiments, the audio processing circuitry 110 may use this output clock signal 116 to process the received audio signal in the second operating mode.

As one example cycle of operation for the DCO 108, the audio controller 102 may be initially processing the received audio signal 104 in the first operating mode and the DCO 108 may accordingly determine an output clock signal 116 based on the first control word 122. The audio controller 102 may then begin transitioning to the second operating mode, such as based on a request or other predetermined condition. As part of this transition, the DCO 108 may determine an output clock signal 116 based on the transition control word 124 for use with the first operating mode and/or the second operating mode during the transition. The transition control word 124 may adjust over a predetermined time period to reach the second control word 126. When the transition is complete, the audio controller 102 may process the received audio signal 104 using the second operating mode and the DCO 108 may determine the output clock signal 116 based on the second control word 126.

As noted previously, the techniques used to determine the transition control word 124 may differ based on how the first operating mode and the second operating mode are implemented. As one specific example, the first operating mode and the second operating mode may utilize clock signals with different levels of precision (such as 7-bit precision, 20-bit precision, and the like). In such embodiments, the transition control word 124 may be determined to transition from a first level of precision of the first control word 122 to a second level of precision of the second control word 126. In additional or alternative embodiments, the first and second operating modes may utilize different control systems for determining the control words 122, 126, and the transition control word 124 may be determined to transition from a first control system for the first operating mode to a second control system for the second operating mode.

In certain embodiments, the first operating mode may utilize a closed-loop control system as the pre-processing circuitry 202 to determine the first control word 122. In certain embodiments, the closed-loop control system 112 may be a phase locked loop system, such as a digital phase locked loop (DPLL) system. In such embodiments, the closed-loop control system 112 may be configured to determine the first control word 122 based on a current clock signal and a reference clock signal.

Returning to FIG. 2, in embodiments where the first control word 122 is determined by a closed-loop control system 112, the transition control word 124 may be determined to transition from the closed-loop control system to another control system used for the second operating mode. As a specific example, the first operating mode may use first control word 122 with a first level of precision (such as determined by the closed-loop control system 112) and the second operating mode may use second control word 126 with a second level of precision lower than the first level of precision. In such instances, the transition control word 124 may be determined to transition from the first level of precision to the second level of precision slowly enough that audible artifacts are not created. In certain instances, the second operating mode may further utilize a different control system (such as an open-loop control system) from the first operating mode. In such instances, the transition control word 124 may be determined to transition between the control systems as well.

In certain embodiments, determining the transition control word 124 includes determining a current frequency value for the first control word 122, determining a target frequency value for the second control word 126 and determining the transition control word 124 to transition from the current frequency value to the target frequency value at a rate less than or equal to a predetermined threshold. In certain embodiments, the rate of transition is determined such that the frequency changes slow enough such that no audible artifacts exist in the processed audio signal. The rate may be less than 0.1%/msec, less than 0.05%/msec, or less than 0.025 msec. In one example, the predetermined rate is less than 50 kHz/ms for a 192 MHz target DCO frequency, which is 0.026%/ms.

Figure 3:
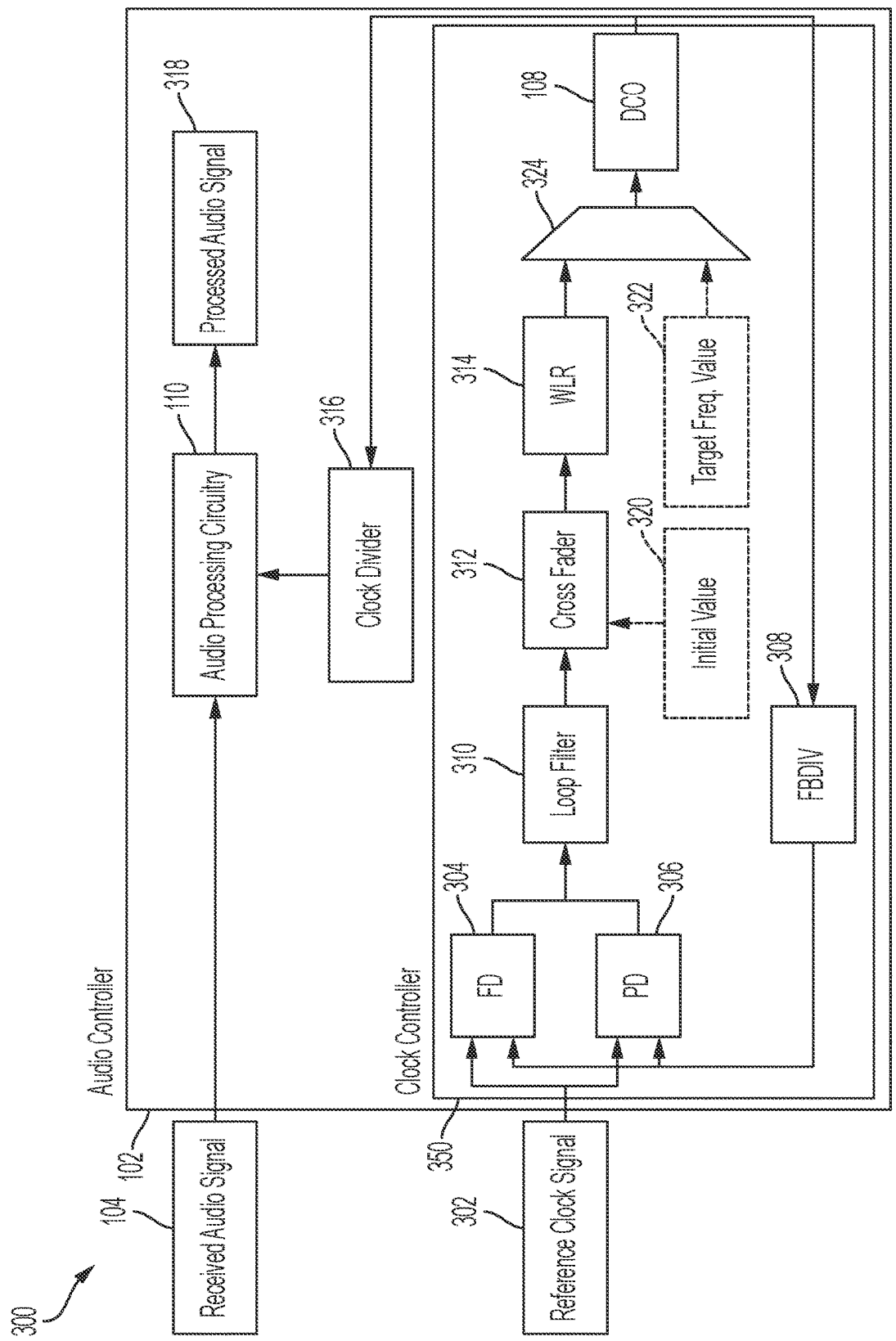
FIG. 3 depicts an example block diagram for determining output clock signals according to one aspect of the present disclosure.

FIG. 3 depicts a block diagram of a system 300 showing an exemplary circuit for determining clock signals for multiple operating modes according to one aspect of the present disclosure. The system 300 includes audio controller 102 having a clock controller 350 for generating a clock signal for driving audio processing circuitry 110. The system 300 is configured to operate in an open-loop mode and a closed-loop mode. The system 300 includes a frequency detector (FD) 304, a phase detector (PD) 306, a feedback divider (FBDIV) 308, a loop filter 310, a cross fader 312, a word length reduction (WLR) 314, a multiplexer 324, the DCO 108, a clock divider 316, and the audio processing circuitry 110. The DCO 108 may be configured to determine the output clock signal 116, which may be received by the clock divider 316 (which may divide the received signal by a fixed integer value) and provided to the audio processing circuitry 110 for use in processing the received audio signal 104. In particular, the audio processing circuitry 110 may process the received audio signal 104 (such as for digital-to-analog conversion) to determine a processed audio signal 318.

In the closed-loop mode, the FD 304 and the PD 306 receive a reference clock signal 302. The FD 304 and the PD 306 also receive the output of the FBDIV 308. The FBDIV 308 divides (e.g., reduces) the output of the DCO 108 by a fixed integer value and provides this divided feedback signal to both FD and PD blocks. The FD 304 may compare the frequencies of the reference clock signal 302 and the feedback signal from the FBDIV 308 and may generate a frequency error signal that represents the difference in frequency. The PD 306 compares the phases of the reference clock signal 302 and the feedback signal from the FBDIV 308 and generates an error signal that represents the phase difference between them.

The loop filter 310 receives the error signals from the FD 304 and the PD 306 and generates a digital control word whose magnitude is determined as an integral or other combination (such as filtered combinations) of the error signals over a preceding time period. The loop filter output may then be received by a cross fader 312 and provided to the word length reduction (WLR) 314. The WLR 314 may be configured to determine a reduced-length control word based on the cross fader output. The control word may then be provided to the DCO 108 via the multiplexer 324. In particular, the audio controller 102 may select the control word from the WLR 314 based on the current operation mode of the audio controller 102. The DCO 108 may then receive the control word and determine the output clock signal according to the above-described techniques. Two example operation modes for the audio controller 102 are a higher-accuracy operation mode and a lower-accuracy operation mode. The higher-accuracy operation mode may implement closed-loop feedback from the DCO 108 through FD 304 and PD 306 to a first input of the multiplexer 324 to improve accuracy of the output of DCO 108. The lower-accuracy operation mode may implement open-loop operation through a second input of the multiplexer 324 to reduce power consumption by allowing feedback elements, such as FBDIV 308, FD 304, PD 306, loop filter 310, and cross fader 312, to be disabled or disconnected. For example, the feedback elements may be head-switched or foot-switched from a voltage supply rail to reduce current passing through the feedback elements. As another example, the feedback elements may be clock gated to reduce current passing through the feedback elements.

In the open-loop mode, a target frequency value 322 (such as a DCO trim control word) is received by the DCO 108 via a second input of the multiplexer 324. When transitioning from the closed-loop mode of the system 300 to the open-loop mode, the cross fader 312 determines a sequence of transition control words to transition the DCO 108 from the current state of the closed-loop loop filter output to the initial value 320 corresponding to the target frequency value 322. The transition control words may cause the transition to occur at a rate less than or equal to a predetermined threshold rate to reduce audible effects appearing in processed audio signal 318 during the transition.

When transitioning from the open-loop mode to the closed-loop mode, the system 300 may be configured to set the initial value of the loop filter 310 based on the target frequency value 322. An error gain (such as an error gain of the loop filter 310) may also be reduced during the transition. The transition control word 124 may then be set based on an output of the WLR 314. For example, the closed-loop mode of the system may be initiated (using the FD 304, the PD 306, the loop filter 310, the FBDIV 308, the cross fader 312, and the WLR 314), and the transition control word may be determined as the resulting output from the WLR 314.

Figure 4:
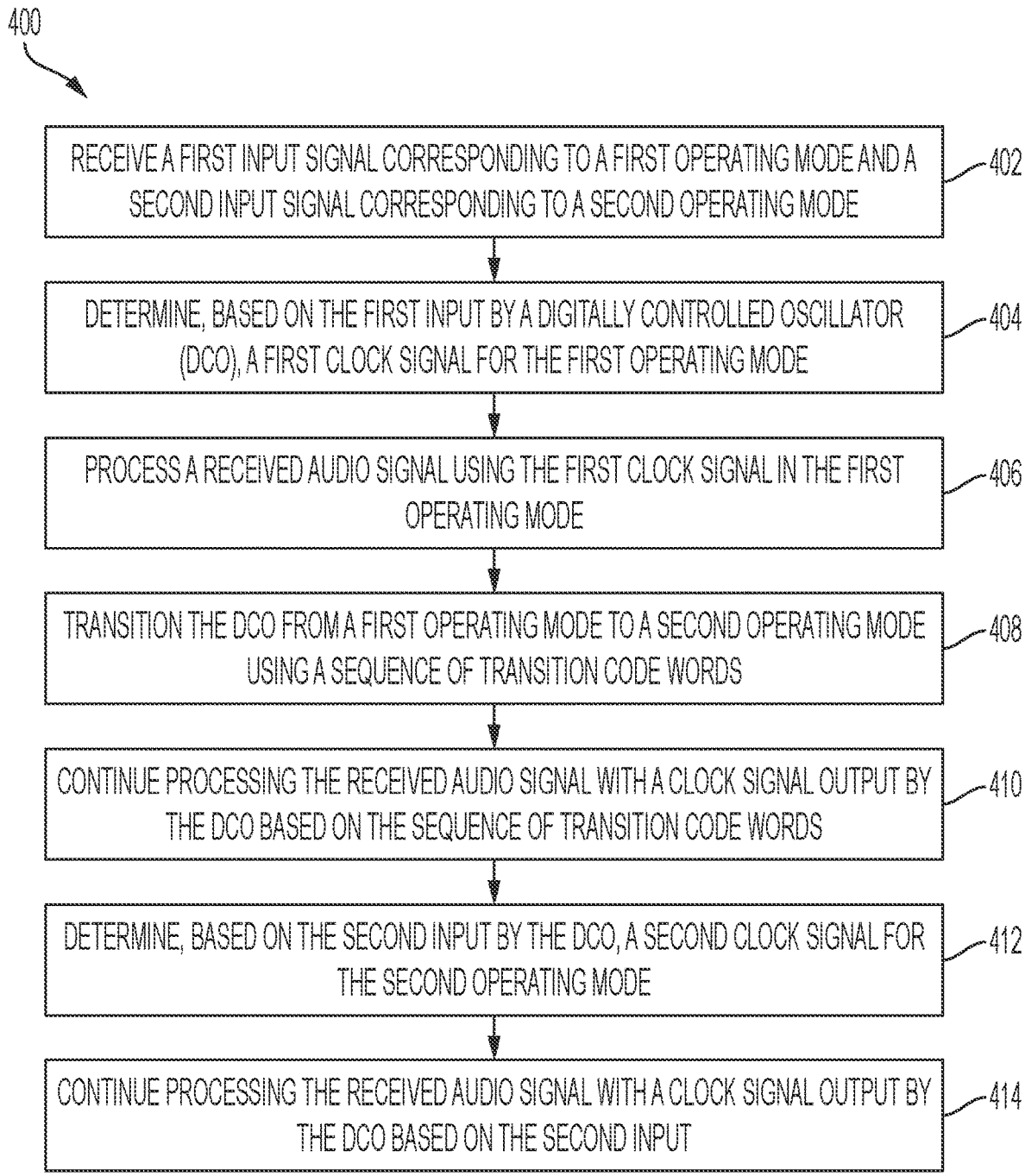
FIG. 4 depicts an example flowchart showing a method according to one aspect of the present disclosure.

FIG. 4 depicts a method 400 according to one aspect of the present disclosure. The method 400 may be implemented by an audio processing system, such as the system 100. For example, the method 400 may be implemented by an audio controller 102 and/or a DCO 108. The method 400 may also be implemented by a set of instructions stored on a computer readable medium that, when executed by a processor, cause a computing device (such as a processor of an audio processing system) to perform the method 400. Although the examples below are described with reference to the flowchart illustrated in FIG. 4, many other methods of performing the acts associated with FIG. 4 may be used. For example, the order of some of the blocks may be changed, certain blocks may be combined with other blocks, one or more of the blocks may be repeated, and some of the blocks may be optional.

The method 400 includes, at block 402, receiving a first input signal corresponding to a first operating mode for processing audio signals and a second input signal corresponding to a second operating mode for processing audio signals.

The method 400 also includes, at block 404, determining a first clock signal for the first operating mode. The first clock signal may be generated by a digitally-controlled oscillator (DCO) based on a first input (e.g., a first control word). The first control word may be generated by a closed-loop control system while the clock controller is operating in the first operating mode.

At block 406, an audio signal is processed using the first clock signal in the first operating mode. In certain embodiments, processing the received audio signal may include digital to analog or analog to digital conversion for playback or recording of the received audio signal 104. The conversion may be performed in a higher-precision mode during the first operating mode.

The audio controller may determine to transition to a second operating mode corresponding to a lower-precision mode of the audio processing circuitry. For example, an input to a microphone coupled to an analog-to-digital converter may reduce in level to below a threshold level for a predetermined duration of time. When no input is provided, the audio controller may transition to the second operating mode to reduce power consumption until audio processing of the microphone signal indicates detection of a keyword or other predetermined sound or sound level. When the keyword is detected, the predetermined sound is detected, or the sound level increases above a threshold level for a predetermined period of time, the audio controller may transition back to the first operating mode to improve the audio processing precision.

At block 408, the audio controller transitions the DCO from a first operating mode to a second operating mode using a sequence of transition control words, which may be determined by the cross fader of FIG. 3. The transition control words transition the output of the DCO from the first input signal (e.g., of the closed-loop control system) to a second input signal (e.g., of the open-loop control system).

At block 410, the audio controller continues processing the audio signal with a clock signal output by the DCO based on the sequence of transition control words. After the transition to the second operating mode, a second clock signal is generated by the DCO based on the second input at block 412. The audio controller continues processing the audio signal at block 414 based on an output of the DCO based on the second input signal. The second input signal may be, for example, a fixed DCO trim value.

Figure 5:
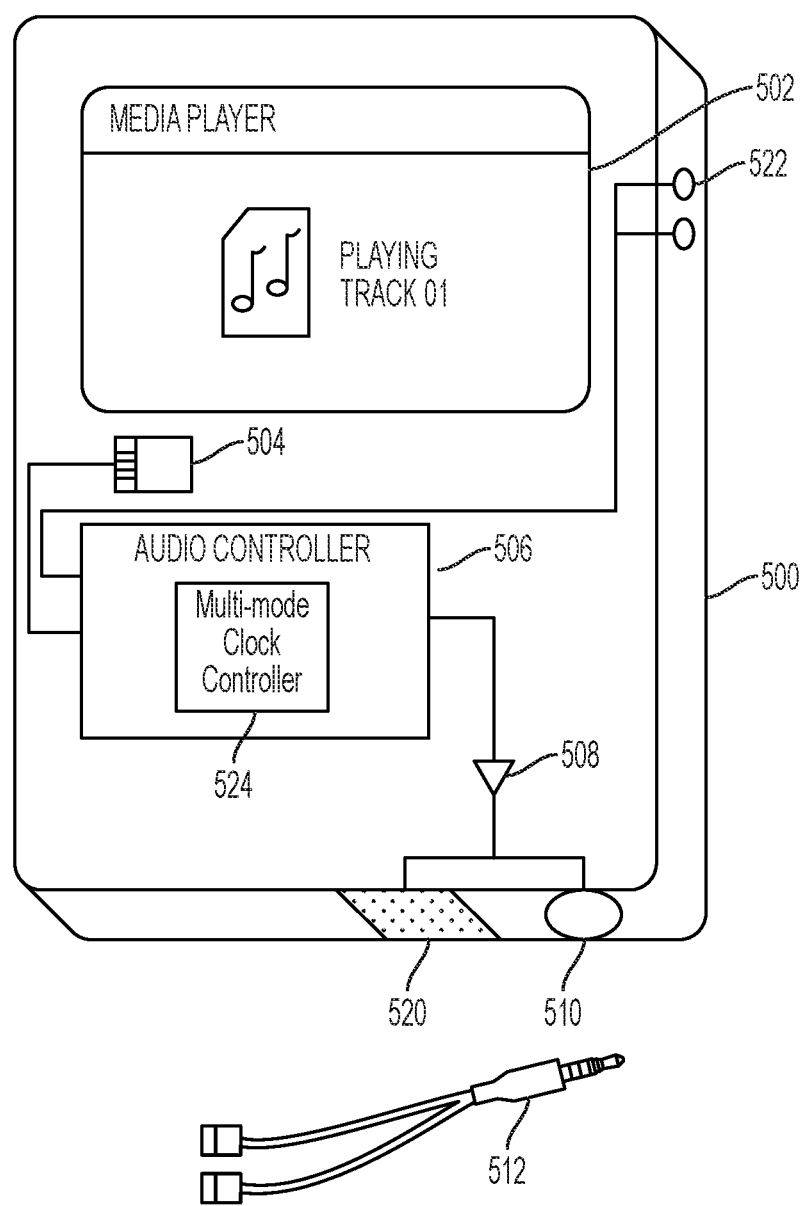
FIG. 5 depicts an example personal media device according to one aspect of the present disclosure.

One advantageous embodiment of an audio controller described herein is for a personal media device for playing back music, high-fidelity music, and/or speech from telephone calls. FIG. 5 is an illustration showing an example personal media device 500 for audio playback including an audio controller that is configured to transition between operating modes without creating audible artifacts according to one aspect of the present disclosure. A personal media device 500 may include a display 502 for allowing a user to select from music files for playback, which may include both high-fidelity music files and normal music files. When music files are selected by a user, audio files may be retrieved from memory 504 by an application processor (not shown) and provided to an audio controller 506. The audio controller 506 may include a multi-mode clock controller 524. The multi-mode clock controller 524 may support clock generation in multiple operating modes corresponding to different operating modes of the audio controller. The multi-mode clock controller 524 may be configured to determine a transition control word for use in transitioning a DCO between operating modes while processing digital audio signals. The digital audio signals (e.g., music or speech) may be converted to analog signals by the audio controller 506, and those analog signals amplified by an amplifier 508. The amplifier 508 may be coupled to an audio output 510, such as a headphone jack, for driving a transducer, such as headphones 512. The amplifier 508 may also be coupled to an internal speaker 520 of the device 500. Although the data received at the audio controller 506 is described as received from memory 504, the audio data may also be received from other sources, such as an Universal Serial Bus (USB) connection, a device connected through Wi-Fi to the personal media device 500, a cellular radio, an Internet-based server, another wireless radio, and/or another wired connection.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor (e.g., CPU or DSP) capable of executing instructions contained in software. The firmware and/or software may include instructions that cause the processing of signals described herein to be performed. The circuitry or software may be organized as blocks that are configured to perform specific functions. Alternatively, some circuitry or software may be organized as shared blocks that can perform several of the described operations. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The described methods are generally set forth in a logical flow of steps. As such, the described order and labeled steps of representative figures are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although ones (1s) and zeros (0s) or highs and lows are given as example bit values throughout the description, the function of ones and zeros may be reversed without change in operation of the processor described in embodiments above. As another example, where general purpose processors are described as implementing certain processing steps, the general purpose processor may be a digital signal processors (DSPs), a graphics processing units (GPUs), a central processing units (CPUs), or other configurable logic circuitry. As a further example, although processing of audio data is described, other data may be processed through the filters and other circuitry described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor (e.g., CPU or DSP) capable of executing instructions contained in software. The firmware and/or software may include instructions that cause the processing of signals described herein to be performed. The circuitry or software may be organized as blocks that are configured to perform specific functions. Alternatively, some circuitry or software may be organized as shared blocks that can perform several of the described operations. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The described methods are generally set forth in a logical flow of steps. As such, the described order and labeled steps of representative figures are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although analog-to-digital converters (ADCs) are described throughout the detailed description, aspects of the disclosure may be applied to the design of other converters, such as digital-to-analog converters (DACs) and digital-to-digital converters, or other circuitry and components based on delta-sigma modulation. As another example, although processing of audio data based on a clock signal from a DCO is described, other data may be processed using DCO circuitry described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a clock controller comprising a digitally controlled oscillator (DCO), the clock controller configured to perform operations comprising:
receiving a first input signal corresponding to a first operating mode having a first resolution for the DCO and a second input signal corresponding to a second operating mode having a second resolution for the DCO lower than the first resolution;
determining, based on the first input signal, a first control word for an output clock signal during the first operating mode;
determining a transition control word for determining the output clock signal during a transition from the first operating mode to the second operating mode; and
determining, based on the second input signal, a second control word for an output signal during the second operating mode.

2. The apparatus of claim 1, wherein the clock controller further comprises a closed-loop control system configured to determine the first input signal.

3. The apparatus of claim 2, wherein the closed-loop control system is configured to:
receive a current clock signal from the DCO and a reference clock signal; and
determine the first input signal based on the current clock signal and the reference clock signal.

4. The apparatus of claim 2, wherein determining the transition control word comprises:
determining a current frequency value of the first input signal;
determining a target frequency value corresponding to the second control word; and
determining at least one transition control word to transition from the current frequency value to the target frequency value at a rate less than or equal to a predetermined threshold.

5. The apparatus of claim 2, wherein the clock controller is configured to disable at least part of the closed-loop control system during the second operating mode.

6. The apparatus of claim 2, further comprising a converter configured to receive an output of the DCO and to process an analog signal based on the output of the DCO at a first resolution using a first power level during the first operating mode and at a second resolution using a second power level during the second operating mode.

7. The apparatus of claim 1, further comprising an open-loop control system configured to determine the second control word based on the second input signal, wherein the second input signal identifies a target frequency value for the second operating mode.

8. The apparatus of claim 7, further comprising a closed-loop control system configured to determine the first input signal, wherein determining the transition control word comprises:
setting an initial value of the closed-loop control system based on the target frequency value;
reducing an error gain of the closed-loop control system; and
determining the transition control word based on an output signal from the closed-loop control system.

9. The apparatus of claim 8, wherein the initial value of the closed-loop control system is set such that the output signal from the closed-loop control system is initially equal to the target frequency value.

10. The apparatus of claim 1, wherein the clock controller comprises a multiplexer configured to select between the first control word and the second control word for input to the DCO.

11. The apparatus of claim 10, wherein the transition control word is input to the multiplexer as the first control word during the transition from the first operating mode to the second operating mode.

12. A method comprising:
receiving a first input signal corresponding to a first operating mode having a first resolution for a digitally-controlled oscillator (DCO) and a second input signal corresponding to a second operating mode having a second resolution for the DCO lower than the first resolution;
determining, based on the first input signal, a first control word for an output clock signal from the DCO in the first operating mode;
determining a transition control word for determining the output clock signal from the DCO during a transition from the first operating mode to the second operating mode; and
determining, based on the second input signal, a second control word for the output clock signal from the DCO during the second operating mode.

13. The method of claim 12, wherein determining the first control word comprises processing an output of the DCO in a closed-loop control system.

14. The method of claim 13, wherein determining the first control word comprises:
   receiving a current clock signal from the DCO and a reference clock signal; and
   determining the first input signal based on the current clock signal and the reference clock signal.

15. The method of claim 13, wherein determining the transition control word comprises:
   determining a current frequency value for the first control word;
   determining a target frequency value for the second control word; and
   determining the transition control word to transition from the current frequency value to the target frequency value at a rate less than or equal to a predetermined threshold.

16. The method of claim 13, further comprising disabling at least part of the closed-loop control system while operating in the second operating mode.

17. An audio controller, comprising:
   a clock controller comprising:
      a digitally-controlled oscillator (DCO);
      a multiplexer coupled to the DCO to select between at least a first input signal for a first operating mode having a first resolution and a second input signal for a second operating mode having a second resolution lower than the first resolution;
      a cross fader providing the first input signal to the multiplexer, wherein the cross fader is configured to transition a value of the first input signal to a value of the second input signal at a predetermined rate when transitioning from the first operating mode to the second operating mode; and
   an audio component coupled to the clock controller for processing an audio signal based on a first clock signal output from the DCO in the first operating mode and a second clock signal output from the DCO in the second operating mode, wherein the second operating mode provides lower precision than the first operating mode.

18. The audio controller of claim 17, wherein the clock controller comprises a closed-loop control system for providing the first input signal to the multiplexer based on an output of the DCO.

19. The audio controller of claim 18, wherein the clock controller comprises an open-loop control system for providing the second input signal to the multiplexer based on a DCO trim value.

20. The audio controller of claim 19, wherein the cross fader provides a sequence of transition control words to the DCO when transitioning from the first operating mode to the second operating mode by transitioning an input to the DCO from the closed-loop control system to the open-loop control system.

* * * * *

UNITED STATES PATENT AND TRADEMARK OFFICE
CERTIFICATE OF CORRECTION

| | | |
|---|---|---|
| PATENT NO. | : 12,261,611 B2 | Page 1 of 1 |
| APPLICATION NO. | : 18/353094 | |
| DATED | : March 25, 2025 | |
| INVENTOR(S) | : Chen et al. | |

It is certified that error appears in the above-identified patent and that said Letters Patent is hereby corrected as shown below:

In the Specification

In Column 1, Line 39, delete "performed" and insert -- performed by --, therefor.

In Column 9, Line 38, delete "0.025 msec." and insert -- 0.025%/msec. --, therefor.

In Column 9, Line 40, delete "0.026%/ms." and insert -- 0.026%/msec. --, therefor.

In Column 12, Line 36, delete "electronically" and insert -- erasable --, therefor.

Signed and Sealed this
Third Day of June, 2025

Coke Morgan Stewart
*Acting Director of the United States Patent and Trademark Office*